United States Patent [19]

Haku et al.

[11] Patent Number: 4,755,483
[45] Date of Patent: Jul. 5, 1988

[54] METHOD FOR PRODUCING SEMICONDUCTOR DEVICE WITH P-TYPE AMORPHOUS SILICON CARBIDE SEMICONDUCTOR FILM FORMED BY PHOTO-CHEMICAL VAPOR DEPOSITION

[75] Inventors: Hisao Haku, Neyagawa; Yukio Nakashima, Hirakata; Tsugufumi Matsuoka, Neyagawa; Kaneo Watanabe, Yawata, all of Japan

[73] Assignee: Sanyo Electric Co., Ltd., Japan

[21] Appl. No.: 888,474

[22] Filed: Jul. 21, 1986

[30] Foreign Application Priority Data

Jul. 30, 1985 [JP] Japan .................. 60-168709
Aug. 20, 1985 [JP] Japan .................. 60-183349

[51] Int. Cl.$^4$ ......................... H01L 21/205
[52] U.S. Cl. .................. 437/100; 136/258; 427/54.1; 437/101
[58] Field of Search ............... 148/1.5, 174; 427/39, 427/53.1, 54.1, 74, 86, 87; 136/258 AM; 357/2, 59 B, 59 C; 204/157.45; 437/100, 101

[56] References Cited

U.S. PATENT DOCUMENTS 4,385,199 5/1983 Hamakawa et al. ........ 136/258 AM
4,585,671 4/1986 Kitagawa et al. .............. 427/54.1

FOREIGN PATENT DOCUMENTS 60-47474 3/1985 Japan ................. 136/258 AM

OTHER PUBLICATIONS

T. Inoue et al., *Appl. Phys. Lett.*, vol. 44, pp. 871–873, (1984).
Y. Mishima et al., *J. Appl. Phys.*, vol. 56, pp. 2803–2805, (1984).
SPC 84-48, Research Meeting, Society of Electricity, pp. 11–20.

*Primary Examiner*—Aaron Weisstuch
*Attorney, Agent, or Firm*—Darby & Darby

[57] ABSTRACT

A method for producing a semiconductor device uses trimethyl boron $(B(CH_3)_3)$ of triethyl boron $(B(C_2H_5)_3)$ or a mixture thereof as a p-type dopant and/or a band gap widening source material gas in a process for forming a p-type amorphous semiconductor film. Accordingly, the quantity and the number of different gases which are used can be reduced and also the photoconductivity and dark conductivity can be improved, whereby a semiconductor device suitable for photovoltaic cells, photo sensors and the like using a p-type amorphous semiconductor film having a wide optical band gap can be produced.

6 Claims, 10 Drawing Sheets

Prior Art

Fig. 9

Prior Art

METHOD FOR PRODUCING SEMICONDUCTOR DEVICE WITH P-TYPE AMORPHOUS SILICON CARBIDE SEMICONDUCTOR FILM FORMED BY PHOTO-CHEMICAL VAPOR DEPOSITION

BACKGROUND OF THE INVENTION

1. Field of the Invention

The present invention relates to a method for producing semiconductor devices suitable as window materials of, for example, photovoltaic cells, photo sensors and the like; and in particular to a method for forming a p-type amorphous semiconductor film for semiconductor devices.

2. Description of the Prior Art

In general, amorphous semiconductors have been produced by chemical vapor deposition (hereinafter referred to as CVD).

In CVD, a gaseous mixture comprising several kinds of source material gases mixed at a desired ratio are flowed into a reaction chamber to be decomposed on a substrate which is in the reaction chamber held under a high vacuum condition and heated to a selected temperature, whereby films are deposited on the substrate.

A photo CVD method using photon energy of ultraviolet rays, a glow discharge plasma CVD method, a thermal CVD method, and the like have been used in the above described generic method for decomposing source material gases.

The photo CVD method is a method in which ultraviolet rays, for example, rays having a wavelength of 184.9 nm, 253.7 nm, etc. generated by a low-pressure mercury lamp are applied to source material gases to decompose them by means of the photon energy of ultraviolet rays.

In the conventional formation of a p-type amorphous silicon carbide film (a-SiC film) by a photo CVD method, disilane ($Si_2H_6$) and the like have been used as a main source material gas, diborane ($B_2H_6$) as a source of boron is used as a dopant material, and dimethyl silane ($SiH_2(CH_3)_2$), methyl silane ($SiH_3(CH_3)$), acetylene ($C_2H_2$) and the like are used as a source of carbon and as a "band gap widening material" for increasing the band gap. This is disclosed in, for example, *Appl. Phys. Lett.*, Vol. 44, No. 9, pp. 871–873 (May 1984) and the like.

With source material gases having the above described composition, diborane, which is used as a source of boron as a dopant material, shows an absorption coefficient for ultraviolet rays lower in comparison with that of disilane, a main source material gas, so that a large amount of diborane is required, as shown in *J. Appl. Phys.*, Vol. 56, No. 10, pp. 2803–2805, (November 1984). Accordingly, much more diborane gas than disilane gas, a main source material gas, is used in the formation of films. However, since diborane, which has not been sufficiently decomposed, remains in this case, the resultant p-type a-SiC film has a reduced conductivity.

In addition, in the case where gases expressed by the general formula $SiH_x(CH_3)_{4-x}$ (methyl silane, dimethyl silane and the like) are used as a source of carbon, their flow rate must be the same as that of the main source material gas.

The above-described method causes a problem, for example, when the flow rate of a mixture gas other than the main source material gas, that is to say, a gas used as a boron source, a gas used as a carbon source and the like, is increased, the flow rate of gases effective for the actual film formation is less than the total flow rate of gases used in the film formation process, whereby the controllability of the film formation reaction is lowered. In addition, if the flow rate of gases other than the main source material gas is increased, the decomposition coefficient of carbon is reduced, whereby undecomposed source material gas is included in the formed film, thereby causing another problem in that film characteristics, such as the optical band gap of the formed p-type a-SiC film, are lowered.

Furthermore, if acetylene is used as a carbon source, the number of C—C bonds in the formed film is increased and consequently the conductivity is badly influenced.

On the other hand, in the glow discharge CVD method in general, monosilane has been used as a source material gas, diborane as a p-type dopant, and methane as a "band gap widening material" for increasing the band gap in the formation of a p-type a-SiC film. This is disclosed in, for example, U.S. Pat. No. 4,385,199 and the like.

However, formation of a p-type a-SiC film by the glow discharge method has caused a problem in that a comparatively large energy is required for the decomposition of both diborane and methane used as source material gases for the glow discharge, the dopant being difficult to introduce into the film, and a resulting p-type a-SiC film having low resistance and a wider optical band gap being difficult to be obtained.

SUMMARY OF THE INVENTION

It is a main object of the present invention to provide a method for producing a p-type amorphous semiconductor film in which source material gases are efficiently decomposed and to reduce the total flow rate thereof as far as possible compared to the known photo CVD method.

It is another object to decompose the source material gases by a discharge of relatively lower energy than the known glow discharge CVD method.

It is yet another object to provide a method where a dopant is easy to introduce into the film during the formation of a p-type amorphous semiconductor film, whereby the characteristics of the film are improved.

According to a method for producing a semiconductor device of the present invention, at least gaseous compounds of group IV elements and trimethyl boron ($B(CH_3)_3$) and/or triethyl boron ($B(C_2H_5)_3$) are used as source material gases.

The above and further objects and features of the invention will more fully be apparent from the following detailed description with accompanying drawings.

DESCRIPTION OF THE PREFERRED EMBODIMENTS

The preferred embodiments of the present invention will be described below with reference to the drawings.

Figure 1:
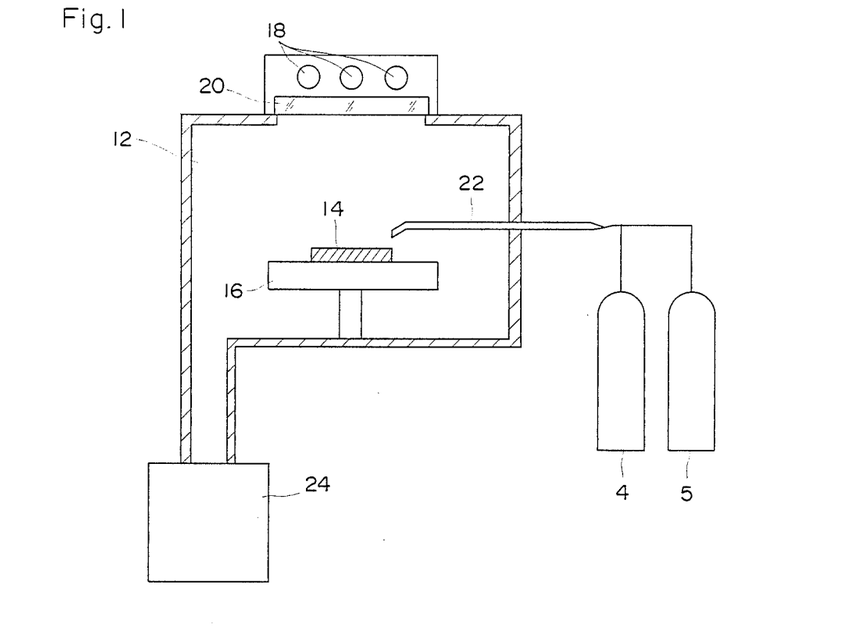
FIG. 1 is a schematic diagram showing a construction of an apparatus for carrying out a method of the present invention by a photo CVD method.

FIG. 1 is a schematic diagram showing a construction of an apparatus used for the production of a semiconductor device including formation of a p-type amorphous semi-conductor films by a photo CVD method as a first preferred embodiment of the present invention.

Referring now to FIG. 1, reference numeral 12 designates a reaction chamber provided with a stage 16 including a heater there within, a substrate 14 held by the stage 16 being adapted to be heated. The substrate 14 is formed of, for example, stainless steel or glass on which a transparent electrode film is previously formed.

The reaction chamber 12 is provided with a low-pressure mercury lamp 18 on the ceiling thereof. Beams of light irradiated from the low-pressure mercury lamp 18 are incident to an ultraviolet ray-introducing window 20 formed of, for example, synthetic silica and the like. Of them, mainly ultraviolet rays having wavelengths of 184.9 and 253.7 nm are selectively introduced into the reaction chamber 12 to impinge upon the substrate 14.

The reaction chamber 12 is also provided with a conduit 22 introduced thereinto. The conduit 22 opens in the vicinity of the substrate 14 at one end thereof and is connected to source material gas tanks 4, 5 arranged outside of the reaction chamber 12 at the other end thereof. Accordingly, source material gases stored in the source material gas tanks 4, 5 are flowed into the reaction chamber 12 by operating a flow control valve (not shown).

The interior of the reaction chamber 12 is held at a pressure of, for example, about 0.1 to 10 Torr by means of a vacuum pump 24.

Now, with an apparatus having the above described construction, the substrate 14 is heated to, for example, 100° to 300° C. by means of the heater, the total flow rate of source material gases form the conduit 22 is set at, for example, 1 to 100 cc/min, and the ratio of flow rate of trimethyl boron $(B(CH_3)_3)$ [triethyl boron $(B(C_2H_5)_3)$ or a mixture of trimethyl boron and triethyl boron may be used in place of trimethyl boron] as a p-type dopant material gas to that of disilane $(Si_2H_6)$ as a main source material gas is set at 0.1 to 10%. And, if ultraviolet rays are continuously impinged upon the substrate 14 from the low-pressure mercury lamp 18 at a radiant power intensity of 1 mW/cm$^2$ or more on the substrate 14, a p-type a-SiC film deposits on the substrate 14.

Sequentially, an i-type semiconductor layer, that is, an i-type amorphous silicon (a-Si:H) film containing hydrogen, and an n-type semiconductor layer, that is, an n-type amorphous silicon (a-Si:H) film containing hydrogen are deposited in turn by suitably selecting source material gases, and then Al or the like is coated by vaporization on the n-type semiconductor layer to form a rear electrode, thereby producing a semiconductor device.

Figure 2:
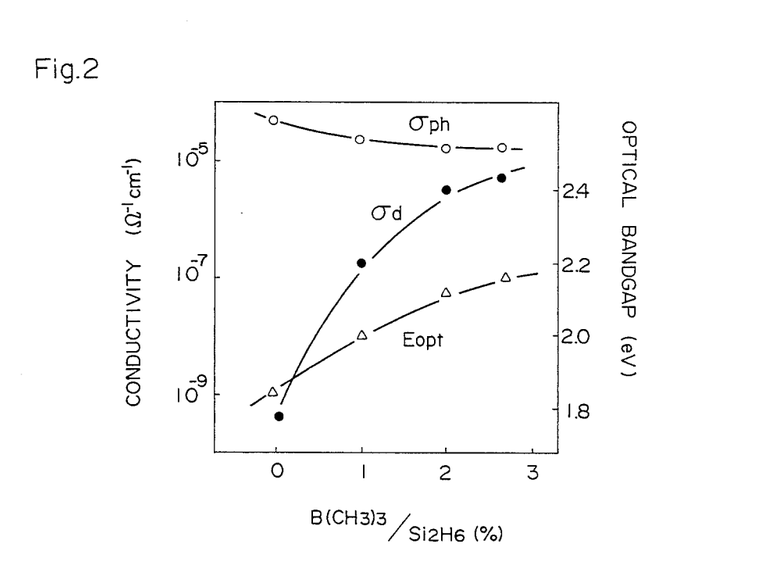
FIGS. 2 and 4 are graphs showing characteristics of p-type amorphous semiconductor films formed by the present invention using the photo CVD method.

FIG. 2 is a graph showing characteristics of a p-type a-SiC film formed by the method of the present invention using the above described apparatus under conditions where the temperature of the substrate 14 is 200° C., the total flow rate of gases is 50 SCCM, the pressure inside the reaction chamber 12 is 5 Torr, and the ratio of the flow rate of the p-type dopant gas to that of the main source material gas is variable. In FIG. 2, the ratio of the flow rate of the p-type dopant gas to that of the main source material gas (%) is shown along the abscissa and the photoconductivity $\sigma_{ph}$ and the dark conductivity $\sigma_d$ (both are expressed in terms of $\Omega^{-1}cm^{-1}$), as well as the optical band gap $E_{opt}$ (expressed in terms of eV), are shown along the ordinate.

Figure 3:
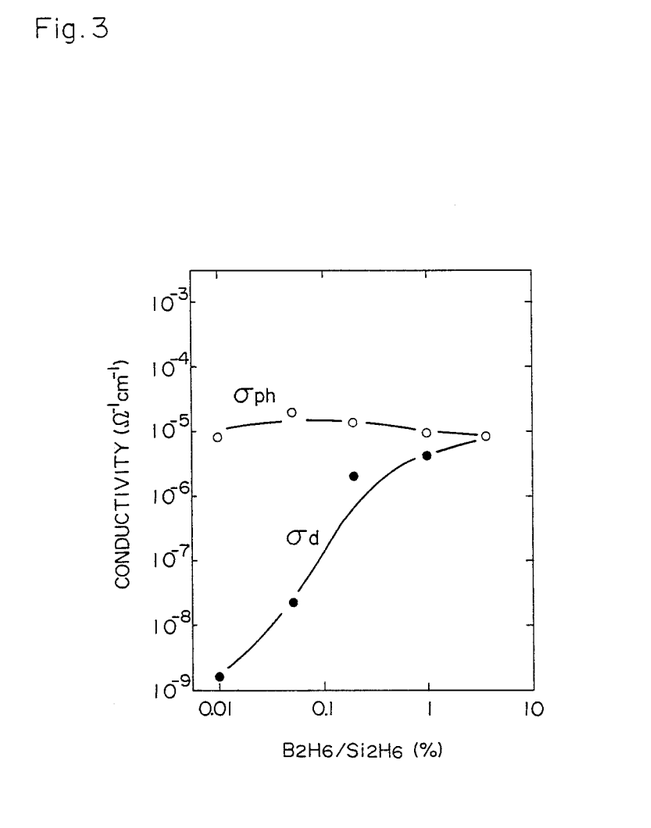
FIG. 3 is a graph showing characteristics of p-type amorphous semiconductor films formed by the conventional photo CVD method.

FIG. 3 is a graph showing characteristics of a p-type a-SiC film formed by the conventional method using diborane as a p-type dopant as shown on p. 16 of "Amorphous Si Solar Cell Obtained by the Photo CVD Method", Material SPC 84-48, Research Meeting, Society of Electricity. In this conventional example, the photoconductivity $\sigma_{ph}$ and the dark conductivity $\sigma_d$ in the case where a p-type a-SiC film is deposited at a substrate temperature of 300° C. and the ratio of the flow rate of the p-type dopant to that of the main source material gas is variable, are shown.

As is obvious from these graphs, according to a method of the present invention, not only the photoconductivity $\sigma_{ph}$ and the dark conductivity $\sigma_d$ are increased but also the optical band gap $E_{opt}$ is widened with an increase of the ratio of the flow rate of trimethyl boron used as p-type dopant source material gas to that of disilane as a main source material gas. In addition, a p-type a-SiC film having sufficient conductivity and optical band gap can be formed even though the ratio of the flow rate of trimethyl boron as a p-type dopant source material gas to that of disilane as a main source material gas is about 1%.

Comparing the method according to the present invention with the conventional method as shown in FIG. 3, the photoconductivity $\sigma_{ph}$ and the dark conductivity $\sigma_{ph}$ both show similar values, and accordingly it seems that there is no significant difference between the method according to the present invention and the conventional method. However, the substrate temperature is 300° C. in this conventional method while the substrate temperature is 200° C. in the preferred embodiment as shown in FIG. 2. Accordingly, since the substrate can be maintained at comparatively low temperatures in this preferred embodiment wherein trimethyl boron is used as a p-type dopant, a bad influence due to heating during forming of the film can be avoided. Furthermore, heat sensitive high molecular resins, such as polyimides, can be used as a substrate material.

In addition, although not shown in FIG. 3, it has been found that the optical band gap is narrowed with an increase of the substrate temperature and the ratio of flow rate of p-type dopant (diborane: $B_2H_6$) to that of main source material gas in the conventional method. On the contrary, this preferred embodiment shown in FIG. 2 is characterized by a widening of the optical band gap with an increase of the ratio of flow rate of trimethyl boron $(B(CH_3)_3)$ as a p-type dopant to that of the main source material gas.

Figure 4:
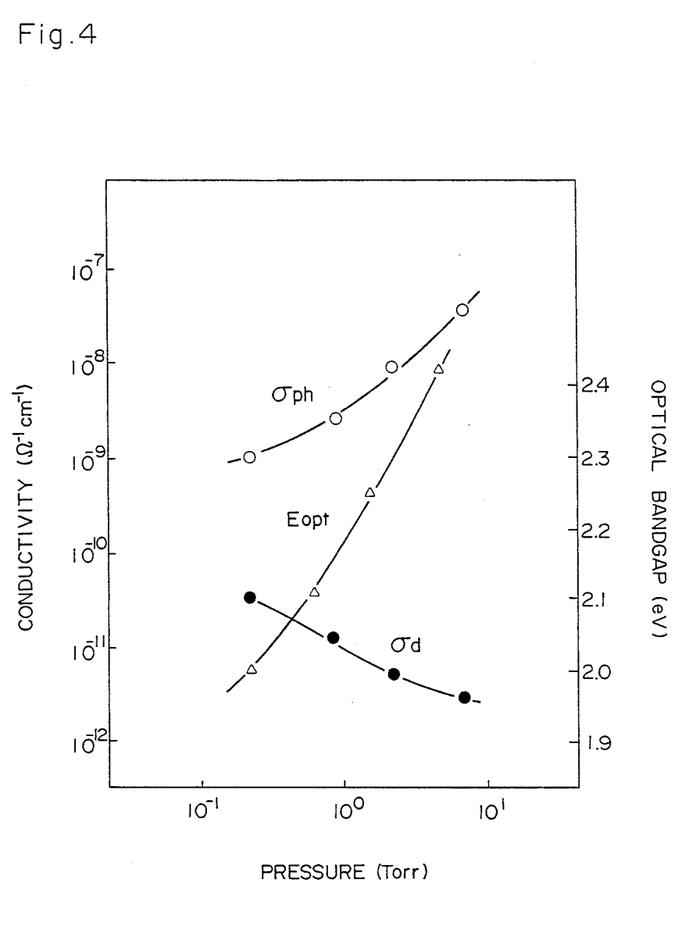

The graph shown in FIG. 4 shows the photoconductivity $\sigma_{ph}$, dark conductivity $\sigma_d$, and optical band gap $E_{opt}$ of a p-type a-SiC film formed under the conditions of substrate 14 temperature of 200° C., flow rate of disilane as a main source material gas of 20 SCCM, flow rate of acetylene as a carbon source of 2 SCCM, flow rate of trimethyl boron as a p-type dopant of 0.02 SCCM, and a variable pressure in the reaction chamber 12.

The graph of FIG. 4 leads to the following consideration: that is to say, although the quantity of carbon included in the film is insufficient and the photoconductivity $\sigma_{ph}$ is reduced at low pressures, if the pressure is 1 Torr or more, a p-type amorphous semiconductor film having a superior photoconductivity can be obtained in a range of optical band gaps wider than that obtained by the conventional method.

As above described, in the case where the substrate temperature is the same as in the conventional case where, for example, diborane ($B_2H_6$) is used as a p-type dopant, it is not required to increase the ratio of flow rate of the p-type dopant source material gas to that of the main source material gas, so that the reaction is easy to control and the characteristics of the formed p-type a-SiC film also can be improved.

Next, the method of the present invention carried out by the glow discharge CVD method will be described.

Figure 5:
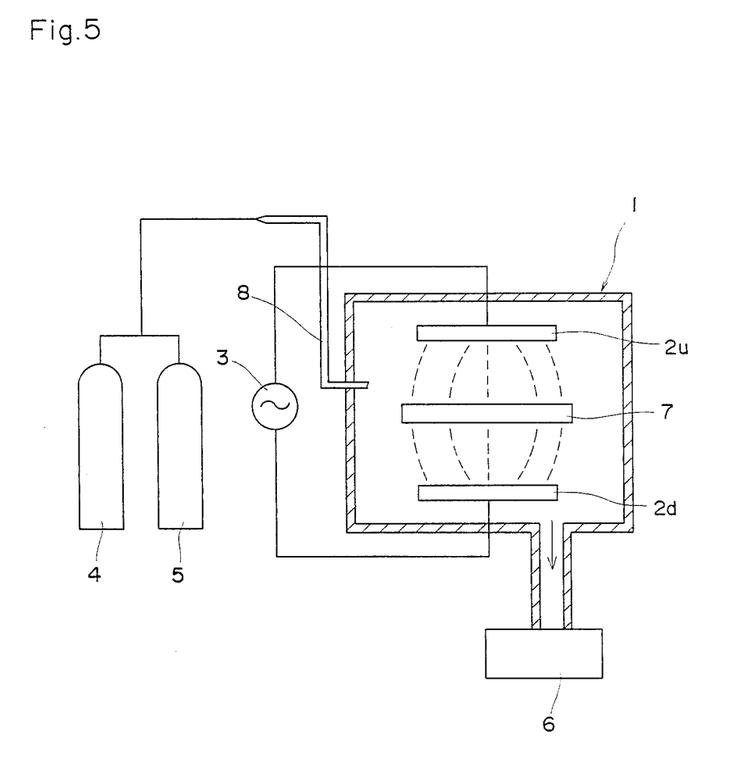
FIG. 5 is a schematic diagram showing a construction of an apparatus for carrying out a glow discharge plasma CVD method according to the present invention.

Referring to FIG. 5, which is a schematic diagram showing the construction of an apparatus for carrying out the glow discharge CVD method of the present invention, reference numeral 1 designates a reaction chamber 2u and 2d designate glow discharge electrodes, 3 designates a high-frequency power source, 4 and 5 designate source material tanks, 6 designates a vacuum pump, 7 designates a substrate held by a holder (not shown), and 8 designates a conduit for introducing source material gases into the reaction chamber 1.

The substrate 7 is formed, of, for example, glass and is previously provided with a transparent electrode formed on a surface thereof. The substrate 7 is held by a holder arranged between the upper electrode 2u and the lower electrode 2d and is heated to the desired temperature by a heater or high-frequency heating device (not shown).

Disilane ($Si_2H_6$) as a main source material gas is stored in the source material gas tank 4 and trimethyl boron ($B(CH_3)_3$) [triethyl boron ($B(C_2H_5)_3$) or a gaseous mixture of trimethyl boron and triethyl boron may be used in place of trimethyl boron] as a p-type dopant source material gas is stored in the source material gas tank 5. They are mixed at a selected ratio and then the resulting mixture is introduced into the reaction chamber 1 through the conduit 8. The source material gases introduced into the reaction chamber 1 are decomposed by the glow discharge conducted between the upper electrode 2u and the lower electrode 2d to form a p-type semiconductor layer, more specifically, a p-type a-SiC film, on the surface of the substrate 7.

Sequentially, (a) an i-type semiconductor layer, that is, an i-type amorphous silicon (a-Si:H) film containing hydrogen, and (b) an n-type semiconductor layer, that is, an n-type amorphous silicon (a-Si:H) film containing hydrogen, are deposited in turn by suitably selecting the source material gases. Then, Al or the like is coated by vaporization on the n-type semiconductor layer to form a deposited rear electrode. Thus, a semiconductor device is produced.

Next, a p-type amorphous semiconductor film obtained by the above described method according to the present invention is compared with that produced by the conventional method, wherein diborane, methane, and silane are used as source material gases.

Figure 6:
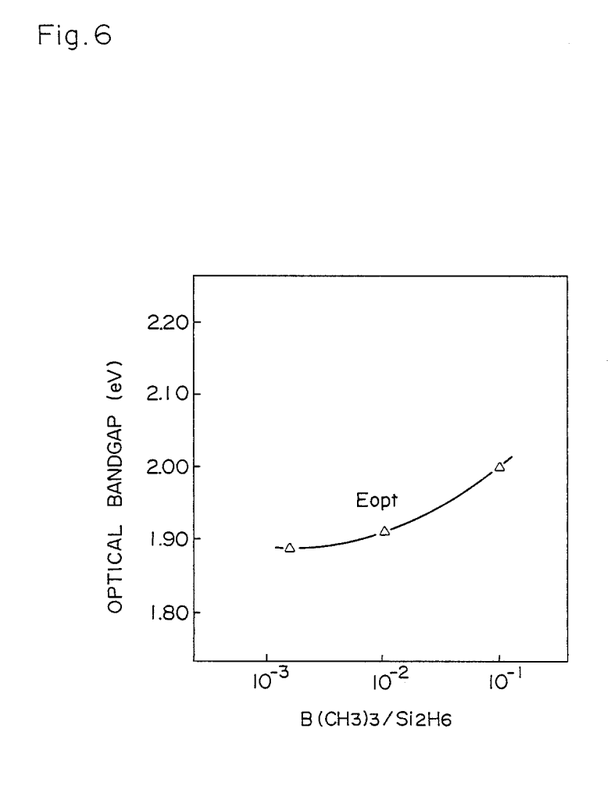
FIGS. 6 and 7 are graphs showing characteristics of p-type amorphous semiconductor films formed by the present invention using glow discharge.
Figure 7:
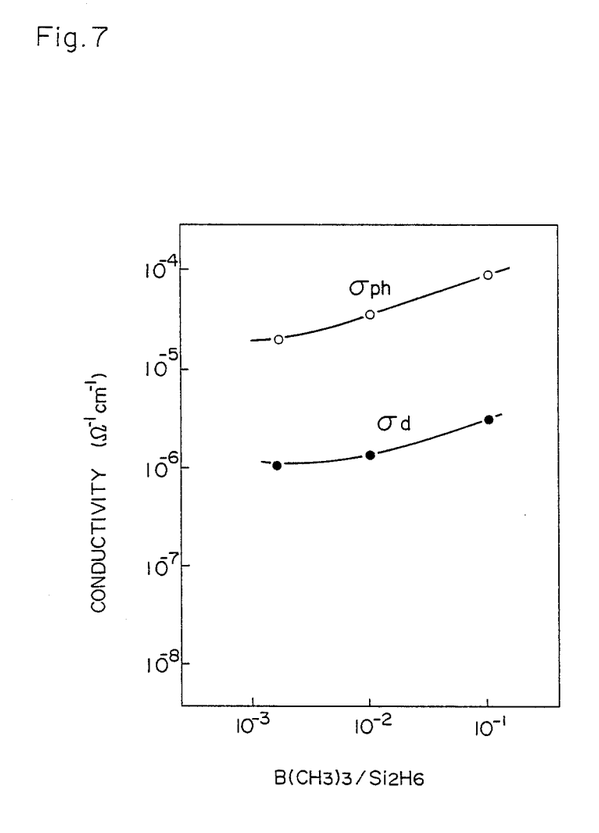
Figure 8:
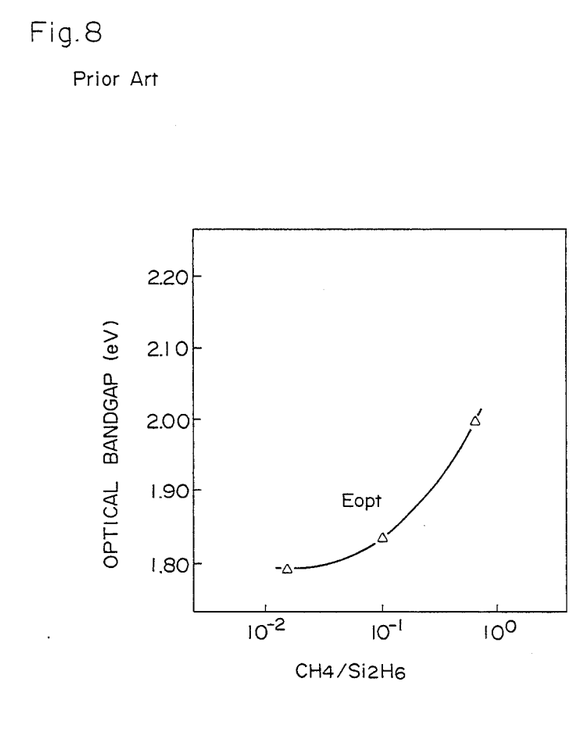
FIGS. 8 and 9 are graphs showing characteristics of p-type amorphous semiconductor films formed by the conventional glow discharge method.
Figure 9:
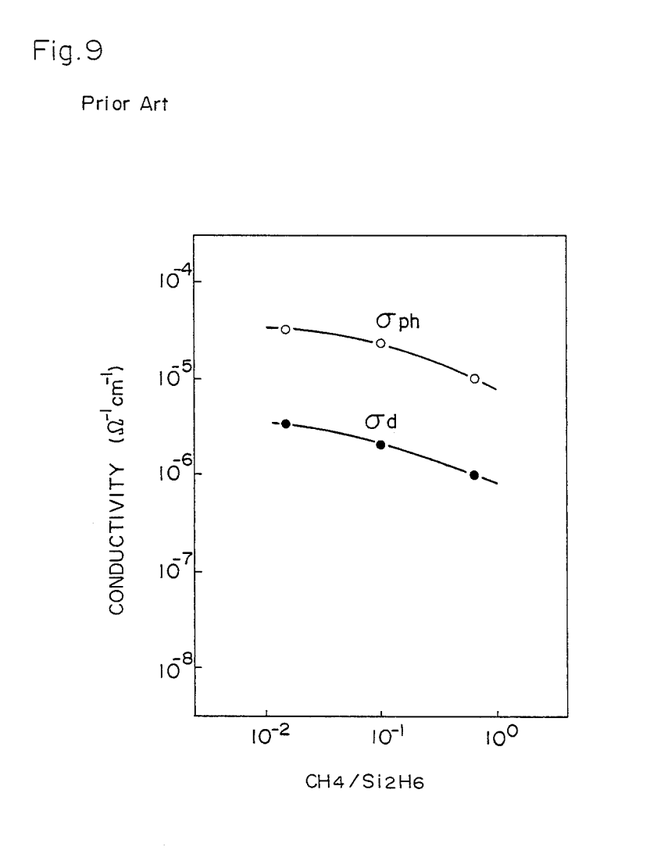

In this preferred embodiment, disilane and trimethyl boron are used as reaction gases and a p-type amorphous semiconductor film is formed under the following conditions:

Subtrate temperature: 200° C.
Reaction pressure: 0.3 Torr
Flow rate of disilane: 20 to 50 SCCM
Flow rate of trimethyl boron: 0.1 to 2 SCCM
High (Radio-) frequency output power: 20 W
Frequency (Radio Frequency): 13.56 MHz The characteristics of the conventional and the inventive amorphous semiconductor films are shown in FIGS. 6 to 9. FIGS. 6 and 7 show the characteristics of a p-type a-SiC film formed by a method of the present invention and FIGS. 8 and 9 show the characteristics of a p-type a-SiC film formed by the conventional method.

In FIG. 6, the ratio of flow rate of $B(CH_3)_3$ to that of source material gas, that is to say $B(CH_3)_3/Si_2H_6$, is shown along the abscissa and the optical band gap (eV) is shown along the ordinate, while in FIG. 8, $CH_4/Si_2H_6$ is shown along the abscissa and the optical band gap (eV) is shown along the ordinate.

Also, in FIG. 7, $B(CH_3)_3/Si_2H_6$ is shown along the abscissa and the conductivity ($\Omega^{-1}cm^{-1}$) is shown along the ordinate, while in FIG. 9 $B_2H_6/Si_2H_6$ is shown along the abscissa and the conductivity ($\Omega^{-1}cm^{-1}$) is shown along the ordinate. In FIGS. 7 and 9 the photoconductivity $\sigma_{ph}$ is plotted by white circles and the dark conductivity $\sigma_d$ is plotted by black circles.

As is obvious from these graphs, a p-type a-SiC film formed by a method of the present invention not only has an optical band gap larger than that of a p-type a-SiC film obtained by the conventional method but also the photoconductivity is improved from $1 \times 10^{-5} \Omega^{-1}cm^{-1}$ to $1 \times 10^{-4} \Omega^{-1}cm^{-1}$ and the dark conductivity from $1 \times 10^{-6} \Omega^{-1}cm$ to $5 \times 10^{-6} \Omega^{-1}cm^{-1}$ at the same value of optical band gap (2.0 eV).

Figure 10:
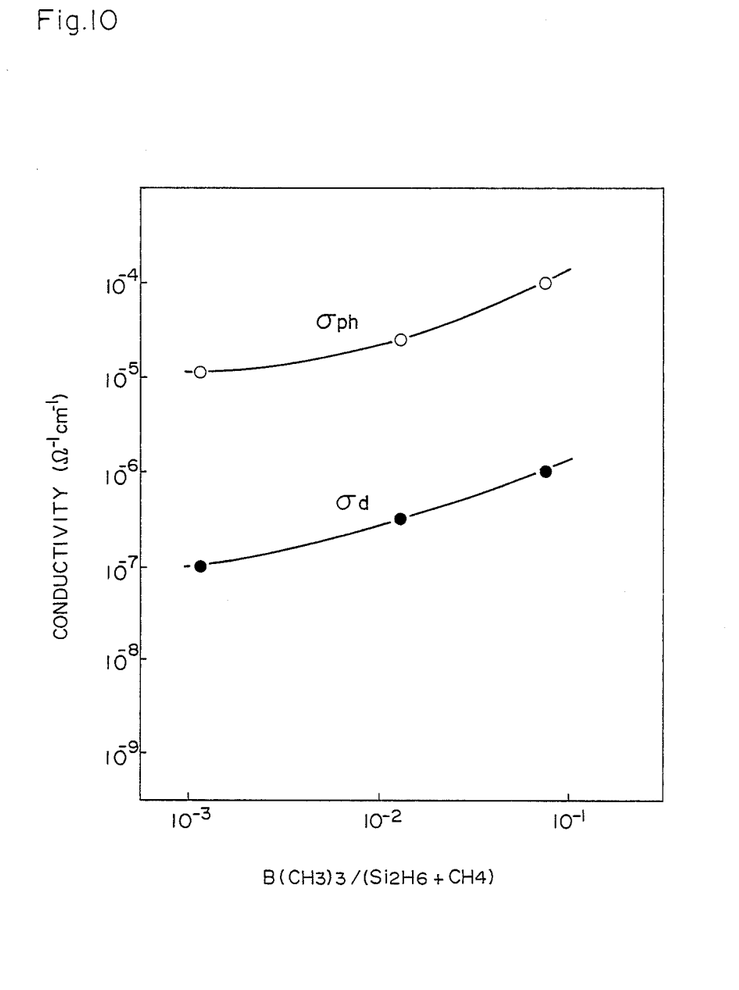
FIGS. 10 and 11 are graphs showing characteristics of p-type amorphous semiconductor films formed in another case where the present invention is carried out by glow discharge.
Figure 11:
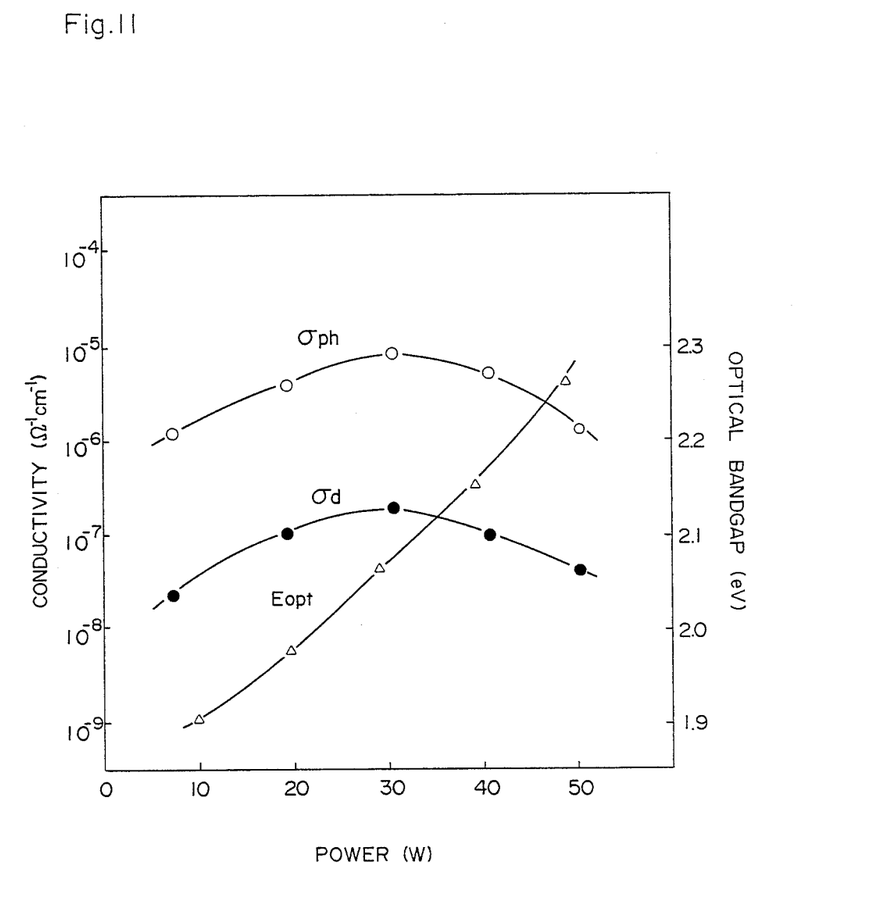

FIG. 10 shows the characteristics of a p-type a-SiC film formed under the conditions where the pressure in the reaction chamber 1 is 0.3 Torr, the substrate temperature is 200° C., the flow rate of disilane as a main source material gas is 20 SCCM, the flow rate of methane as a band gap widening material is 2 SCCM, the flow rate of trimethyl boron as a p-type dopant is 0.02 SCCM, and the radio-frequency output power applied to a glow lamp is variable.

As a result, sufficiently superior characteristics are obtained with respect to both conductivity and optical band gap at a radio-frequency output of 20 to 30 W in spite of the small ratio of the flow rate of the p-type dopant source material gas to that of the main source material gas and a relatively lower substrate temperature of 200° C.

As described above, according to the method of the present invention, trimethyl boron used as a p-type dopant and band gap widening source material gas of a p-type amorphous semiconductor film is easy to decompose, whereby not only both the number of different gases and the flow rate of the reaction gases used can be reduced, but also the dark conductivity and photoconductivity are improved, thereby enabling production of a p-type amorphous semiconductor film having a low resistance and an increased optical band gap.

In addition, although not being concretely described, it is noted that similar effects as in the case of the above described photo CVD method or the glow discharge plasma CVD method can be achieved by depositing a p-type amorphous semiconductor film using the thermal CVD method by which source material gases are thermally decomposed.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. In a method for producing a semiconductor device by forming a p-type amorphous silicon carbide film according to a photo-chemical vapor deposition method in which components obtained by decomposing source material gases are deposited on a substrate to form the semiconductor film, the improvement comprising the steps of irradiating the substrate with a low pressure mercury lamp in the presence of a mixture of a higher silane and at least one of trimethyl boron and triethyl boron as source gasses, under a reduced pressure substantially below on atmosphere, and simultaneously doping boron and adding carbide while forming the amorphous silicon carbide film on the substrate.

2. A method according to claim 1, wherein at least one of said trimethyl boron and triethyl boron is used as p-type dopant or band gap widening source material.

3. A method according to claim 2, wherein other boron source gases are included as said p-type dopant.

4. A method according to claim 2, wherein other carbon source gases are included as said band gap widening material.

5. A method according to claim 1, wherein said reduced pressure is less than 10 Torr.

6. In a method for producing a semiconductor device by forming a p-type amorphous silicon carbide film according to a photo-chemical vapor deposition method in which components obtained by decomposing source material gases are deposited on a substrate to form the semiconductor film, the improvement comprising the steps of irradiating the substrate with a low pressure mercury lamp in the presence of a mixture of a higher silane and at least one of trimethyl boron and triethyl boron as source gasses, under a pressure of less than 10 Torr, and simultaneously doping boron and adding carbide while forming the amorphous silicon carbide film on the substrate.

* * * * *